(12) United States Patent
Suzuki

(10) Patent No.: US 7,495,475 B2
(45) Date of Patent: Feb. 24, 2009

(54) DRIVE CIRCUIT

(75) Inventor: Toshio Suzuki, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 11/840,687

(22) Filed: Aug. 17, 2007

(65) Prior Publication Data

US 2008/0048722 A1 Feb. 28, 2008

(30) Foreign Application Priority Data

Aug. 24, 2006 (JP) ............... 2006-227964

(51) Int. Cl.
*H03K 19/0175* (2006.01)
*H03K 19/094* (2006.01)
(52) U.S. Cl. ............... 326/83; 326/62; 326/82
(58) Field of Classification Search ............ None
See application file for complete search history.

(56) References Cited

U.S. PATENT DOCUMENTS

| | | | |
|---|---|---|---|
| 6,788,116 B1 * | 9/2004 | Cook et al. | 327/108 |
| 6,819,145 B2 * | 11/2004 | Swartz et al. | 327/65 |
| 6,856,178 B1 * | 2/2005 | Narayan | 327/108 |
| 7,038,502 B2 * | 5/2006 | Yamaguchi | 327/108 |

FOREIGN PATENT DOCUMENTS

| JP | 2004-112453 | 4/2004 |
|---|---|---|
| JP | 2005-109897 | 4/2005 |

* cited by examiner

*Primary Examiner*—Rexford Barnie
*Assistant Examiner*—Matthew C Tabler
(74) *Attorney, Agent, or Firm*—Oblon, Spivak, McClelland, Maier & Neustadt, P.C.

(57) ABSTRACT

A drive circuit includes a load circuit, first and second series circuits, a bias circuit, and first and second voltage applying units. The load circuit is arranged between first and second nodes. The first series circuit is arranged between a first power supply node for supply of a first voltage and a second power supply node for supply of a second voltage. The first series circuit includes a first first-type transistor and a first second-type transistor connected in series with the first node therebetween. The second series circuit includes a second first-type transistor and a second second-type transistor connected in series with the second node therebetween. The bias circuit generates a first bias voltage to bias the first and second first-type transistors and generates a second bias voltage to bias the first and second second-type transistors. The first and second voltage applying units each include a plurality of switches.

3 Claims, 11 Drawing Sheets

DRIVE CIRCUIT

CROSS REFERENCES TO RELATED APPLICATIONS

The present invention contains subject matter related to Japanese Patent Application JP 2006-227964 filed in the Japanese Patent Office on Aug. 24, 2006, the entire contents of which are incorporated herein by reference.

BACKGROUND OF THE INVENTION

1. Field of the Invention

The present invention relates to drive (driver) circuits of outputting signals at high speed.

More particularly, the present invention relates to a low voltage differential signaling (LVDS) circuit.

2. Description of the Related Art

LVDS circuits intended for logical-signal output and high-impedance output at high speed are known. For example, Japanese Unexamined Patent Application Publication No. 2005-109897 discloses such an LVDS circuit.

FIG. 1 illustrates the basic circuit configuration of an LVDS circuit.

Referring to FIG. 1, an LVDS circuit 100 includes a first series circuit composed of a P-channel MOS transistor MP101 and an N-channel MOS transistor MN101, a second series circuit composed of a P-channel MOS transistor MP102 and an N-channel MOS transistor MN102, a first current source 11, and a second current source 12. The first series circuit is parallel to the second series circuit. The first current source 11 and the second current source 12 are connected to the first and second series circuits, respectively.

A first voltage VDD and a second voltage VSS are supplied to the LVDS circuit 100. A load circuit 110, equivalently represented as a resistor R, is connected to a node N1 and a node N2 in the LVDS circuit 100.

The operation of the LVDS circuit 100 in FIG. 1 will now be described in brief.

A control circuit (not shown) respectively supplies switching drive signals SW($\phi$1), SW($\phi$2), SW($\phi$3), and SW($\phi$4) to the transistors MP101, MP102, MN101, and MN102 so that two transistors diagonally arranged at opposite sides of the node N1, for example, the transistors MP101 and MN102 are simultaneously turned on or off in a first mode (phase) and the transistors MP102 and MN101 are simultaneously turned on or off in a second mode (phase) that is opposite in phase to the first mode.

The first and second switching drive signals SW($\phi$1) and SW($\phi$2) are differential signals (i.e., anti-phase signals or complementary signals). Similarly, the third and fourth switching drive signals SW($\phi$3) and SW($\phi$4) are differential (anti-phase) signals. On the other hand, the first and fourth switching drive signals SW($\phi$1) and SW($\phi$4) are in-phase signals. The second and third switching drive signals SW($\phi$2) and SW($\phi$3) are also in-phase signals.

In other words, in the first mode, the diagonally opposing transistors MP101 and MN102 are simultaneously turned on and the diagonally opposing transistors MP102 and MN101 are turned off. Consequently, the first current source 11, the transistor MP101, the node N1, the load circuit 110, the node N2, the transistor MN102, and the second current source 12 constitute a circuit, thus providing a current path P2 shown by a dashed line.

On the other hand, in the second mode, the diagonally opposing transistors MP102 and MN101 are simultaneously turned on and the diagonally opposing transistors MP101 and MN102 are turned off. Consequently, the first current source 11, the transistor MP102, the node N2, the load circuit 110, the node N1, the transistor MN101, and the second current source 12 constitute a circuit, thus providing a current path P1 shown by a solid line.

Repeating the above-described operation permits an output current Iout, of which the polarity is switched between positive and negative, to flow through the load circuit 110.

Japanese Unexamined Patent Application Publication No. 2005-109897 discloses a technique for providing a bypass circuit to overcome disadvantages of the above-described LVDS circuit.

The disadvantages of the above-described LVDS circuit will now be described.

In the LVDS circuit 100, the transistors MP101 and MN102 each function as an analog switch that allows the output current Iout to flow through the load circuit 110 upon providing the above-described current path P2 and the other transistors MP102 and MN101 each operate as an analog switch that allows the output current Iout to flow through the load circuit 110 upon providing the current path P1. In each of the transistors MP101, MP102, MN101, and MN102 operating as analog switches, a voltage drop is caused by the on-resistance of the transistor. The operating voltage of the LVDS circuit 100 is expressed by the following Expression (1):

$$[VdsP+(Ron1+Ron2+R) \times Iout+VdsN] < (VDD-VSS) \qquad (1)$$

where VdsP denotes the pinch-off voltage of the P-channel transistor, VdsN indicates that of the N-channel transistor, and Ron1 and Ron2 denote the respective on-resistances.

Unfortunately, it is difficult to reduce the difference (VDD−VSS) between the first voltage VDD and the second voltage VSS.

When the second voltage VSS is set to the ground potential, it is difficult in the LVDS circuit 100 to lower the first voltage VDD. Disadvantageously, it is difficult to realize the low-voltage operation of the LVDS circuit. Therefore, the size of each transistor is increased. For example, when the LVDS circuit 100 is constructed as an IC, it is difficult to reduce the layout area of the circuit.

In order to reduce the on-resistance of each transistor, the size of the transistor may be increased. On the other hand, in order to allow the LVDS circuit to operate at high speed, the gate of each transistor should be driven at high speed. The larger the size of each transistor, the larger the gate capacitance. Disadvantageously, it results in an increase in the power consumption of logic elements.

Japanese Unexamined Patent Application Publication No. 2004-112453 discloses a circuit which includes a first differential amplifier 21 and a second differential amplifier 22, as shown in FIG. 2, in order to overcome the above-described disadvantages.

Referring to FIG. 2, a first switching drive signal SW($\phi$1) and a second switching drive signal SW($\phi$2), which are supplied to the first differential amplifier 21, are differential (anti-phase) signals. Similarly, a third switching drive signal SW($\phi$3) and a fourth switching drive signal SW($\phi$4), which are supplied to the second differential amplifier 22, are differential (anti-phase) signals.

The operating voltage of an LVDS circuit 100A illustrated in FIG. 2 is expressed as the following Expression (2).

$$(VdsP+VdsN) < (VDD-VSS) \qquad (2)$$

As is clear from Expression (2), the LVDS circuit 100A has advantages in that the circuit is not affected by the on-resistances of transistors and the operating voltage of the circuit is reduced.

SUMMARY OF THE INVENTION

The LVDS circuit 100A in FIG. 2, however, has the following disadvantages.

The LVDS circuit 100A needs the first and second differential amplifiers 21 and 22. Accordingly, incorporating the LVDS circuit 100A into an IC chip results in an increase in the number of elements and an increase in power consumption.

In order to realize high-speed operation, high-speed differential switching drive signals are supplied to the LVDS circuit 100A. Since it is difficult to operate the first and second differential amplifiers 21 and 22 at high speed, the operating frequency of the LVDS circuit 100A is limited. In other words, the LVDS circuit 100A in FIG. 2 is difficult to operate at high speed.

It is desirable to overcome the above-described disadvantages.

According to the present invention, it is desirable to provide a drive circuit, such as an LVDS circuit, in which the operation can be performed at lower voltage than the related art LVDS circuits and the operating frequency limit can be minimized with a simple circuit configuration without increasing in size.

According to an embodiment of the present invention, a drive circuit includes a load circuit arranged between a first node and a second node, a first series circuit arranged between a first power supply node for supply of a first voltage and a second power supply node for supply of a second voltage, the first series circuit including a first first-type transistor and a first second-type transistor connected in series with the first node therebetween, a second series circuit including a second first-type transistor and a second second-type transistor connected in series with the second node therebetween, a bias circuit that generates a first bias voltage to bias the first and second first-type transistors and generates a second bias voltage to bias the first and second second-type transistors, a first voltage applying unit, and a second voltage applying unit. In a first mode, the first voltage applying unit applies the first bias voltage to the first first-type transistor, applies the first voltage to the second first-type transistor, applies the second bias voltage to the second second-type transistor, and applies the second voltage to the first second-type transistor. The first voltage applying unit includes a plurality of switches. In a second mode, the second voltage applying unit applies the first bias voltage to the second first-type transistor, applies the first voltage to the first first-type transistor, applies the second bias voltage to the first second-type transistor, and applies the second voltage to the second second-type transistor. The second voltage applying unit includes a plurality of switches.

Each first-type transistor is, for example, a P-channel transistor, each second-type transistor is, for example, an N-channel transistor, and vice versa.

Preferably, the switches in the first voltage applying unit and the switches in the second voltage applying unit include first to eighth switches. The first and second switches are connected in parallel to apply the first voltage to the first and second first-type transistors in a complementary manner. The third and fourth switches are connected in parallel to apply the first bias voltage to the first and second first-type transistors in a complementary manner. The fifth and sixth switches are connected in parallel to apply the second bias voltage to the first and second second-type transistors in a complementary manner. The seventh and eighth switches are connected in parallel to apply the second voltage to the first and second second-type transistors in a complementary manner.

Preferably, the combination of the first first-type transistor and the second second-type transistor or the combination of the second first-type transistor and the first second-type transistor cooperates with the bias circuit in functioning as the combination of current sources for the load circuit.

Preferably, the bias circuit includes a series circuit arranged between the first and second power supply nodes. The series circuit includes a first diode, a bias current source, and a second diode. One terminal of the bias current source is connected to a node between the third and fourth switches. The other terminal of the bias current source is connected to a node between the fifth and sixth switches.

Preferably, the drive circuit further includes a voltage detection circuit that detects a voltage between the first and second nodes and a first differential operational amplifier circuit having a first input terminal and a second input terminal, the first input terminal being supplied with a reference voltage, the second input terminal being supplied with the voltage detected by the voltage detection circuit. The bias circuit includes a series circuit, which is arranged between the first and second power supply nodes, and the first differential operational amplifier circuit. The series circuit includes a bias current source and a diode. An output terminal of the first differential operational amplifier circuit is connected to a node between the third and fourth switches. One terminal of the bias current source is connected to a node between the fifth and sixth switches.

Preferably, the drive circuit further includes a voltage detection circuit that detects a voltage between the first and second nodes, a first differential operational amplifier circuit having a first input terminal and a second input terminal, a series circuit, a second differential operational amplifier circuit having a first input terminal and a second input terminal, and a ninth switch and a tenth switch connected in parallel. The first input terminal of the first differential operational amplifier circuit is supplied with a reference voltage and the second input terminal thereof is supplied with the voltage detected by the voltage detection circuit. The series circuit is arranged between the first and second power supply nodes. The series circuit includes a bias current source and a transistor. The first input terminal of the second differential operational amplifier circuit is connected to a node between the bias current source and the transistor. The ninth and tenth switches are turned on and off in a complementary manner. The ninth switch is arranged between one terminal of the voltage detection circuit and the second input terminal of the second differential operational amplifier circuit. The tenth switch is arranged between the other terminal of the voltage detection circuit and the second input terminal of the second differential operational amplifier circuit. The bias circuit includes a series circuit including the bias current source and the transistor, the first differential operational amplifier circuit, the ninth switch, the tenth switch, and the second differential operational amplifier circuit. An output terminal of the first differential operational amplifier circuit is connected to a node between the third and fourth switches. An output terminal of the second differential operational amplifier circuit is connected to a node between the fifth and sixth switches and is connected to a control terminal of the transistor.

Preferably, the drive circuit further includes a precharge bias circuit. The precharge bias circuit generates a first precharge bias voltage approximate to the threshold voltages of the first and second first-type transistors and a second precharge bias voltage approximate to the threshold voltages of the first and second second-type transistors. In the first mode, the first voltage applying unit applies the first bias voltage to the first first-type transistor, applies the second bias voltage to the second second-type transistor, applies the first precharge bias voltage to the second first-type transistor, and applies the second precharge bias voltage to the first second-type transistor. In the second mode, the second voltage applying unit applies the first bias voltage to the second first-type transistor, applies the second bias voltage to the first second-type transistor, applies the first precharge bias voltage to the first first-type transistor, and applies the second precharge bias voltage to the second second-type transistor.

In the drive circuit according to the embodiment of the present invention, the low voltage operation can be performed and the operating frequency limit can be minimized with a simple circuit configuration without increasing in size.

According to the embodiment of the present invention, the current consumption can be reduced.

Furthermore, according to the embodiment of the present invention, the common mode voltage can be controlled.

In addition, according to the embodiment of the present invention, the operating speed can be increased.

According to the embodiment of the present invention, the drive circuit does not need a short-circuit protection circuit.

DESCRIPTION OF THE PREFERRED EMBODIMENTS

First Embodiment

An LVDS circuit, serving as a drive circuit according to a first embodiment of the present invention, will now be described with reference to FIGS. 3 to 6.

Figure 3:
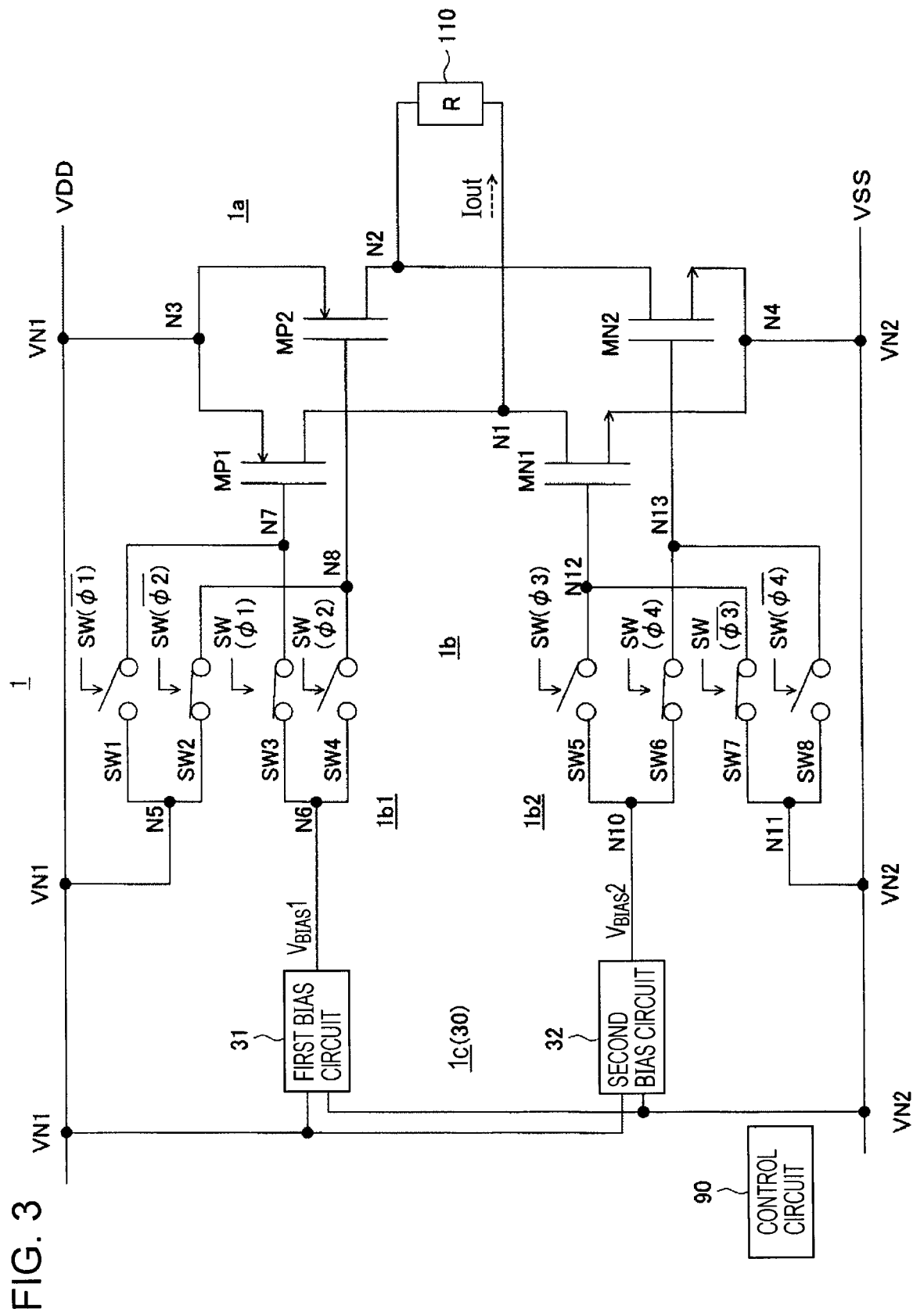
FIG. 3 is a circuit diagram illustrating an LVDS circuit, serving as a drive circuit according to a first embodiment of the present invention, the LVDS circuit being in a first mode.
Figure 4:
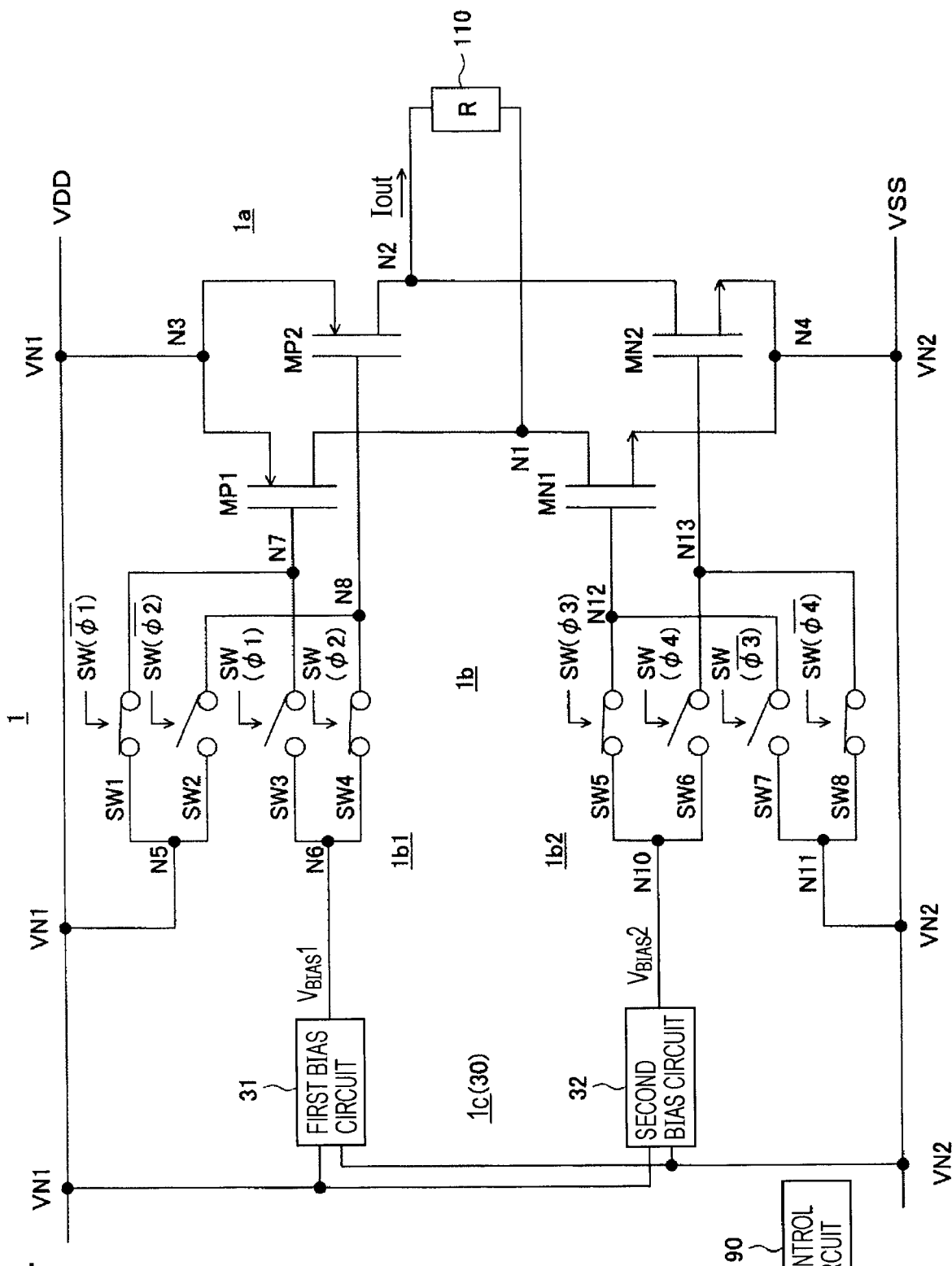
FIG. 4 is a circuit diagram showing the LVDS circuit according to the first embodiment, the LVDS circuit being in a second mode.

FIG. 3 illustrates an LVDS circuit 1 in a first mode (phase). FIG. 4 illustrates the LVDS circuit 1 in a second mode (phase) that is opposite in phase to the first mode.

Referring to FIGS. 3 and 4, the LVDS circuit 1 includes an LVDS basic circuit 1a, a switching circuit 1b, a bias circuit 1c (30), and a control circuit (or signal transmission circuit) 90.

LVDS Basic Circuit 1a

The LVDS basic circuit 1a includes a first series circuit and a second series circuit such that the first and second series circuits are arranged parallel to each other. The first series circuit includes a P-channel MOS transistor MP1 and an N-channel MOS transistor MN1, which are connected in series. The second series circuit includes a P-channel MOS transistor MP2 and an N-channel MOS transistor MN2, which are connected in series. The LVDS circuit 1 is supplied with a first voltage VDD and a second voltage VSS from a first power supply node VN1 and a second power supply node VN2, respectively.

Each P-channel MOS transistor serves as a first-type transistor according to the embodiment and each N-channel MOS transistor serves as a second-type transistor according to the embodiment.

A load circuit 110, equivalently represented as a resistor R, is connected to a node N1 and a node N2 in the LVDS basic circuit 1a.

In the present embodiment, preferably, the transistors MP1 and MP2 have the same size. Similarly, the transistors MN1 and MN2 have the same size. The reason is that a current flowing through the transistors MP1 and MN2 is equivalent to that flowing through the transistors MP2 and MN1.

Figure 1:
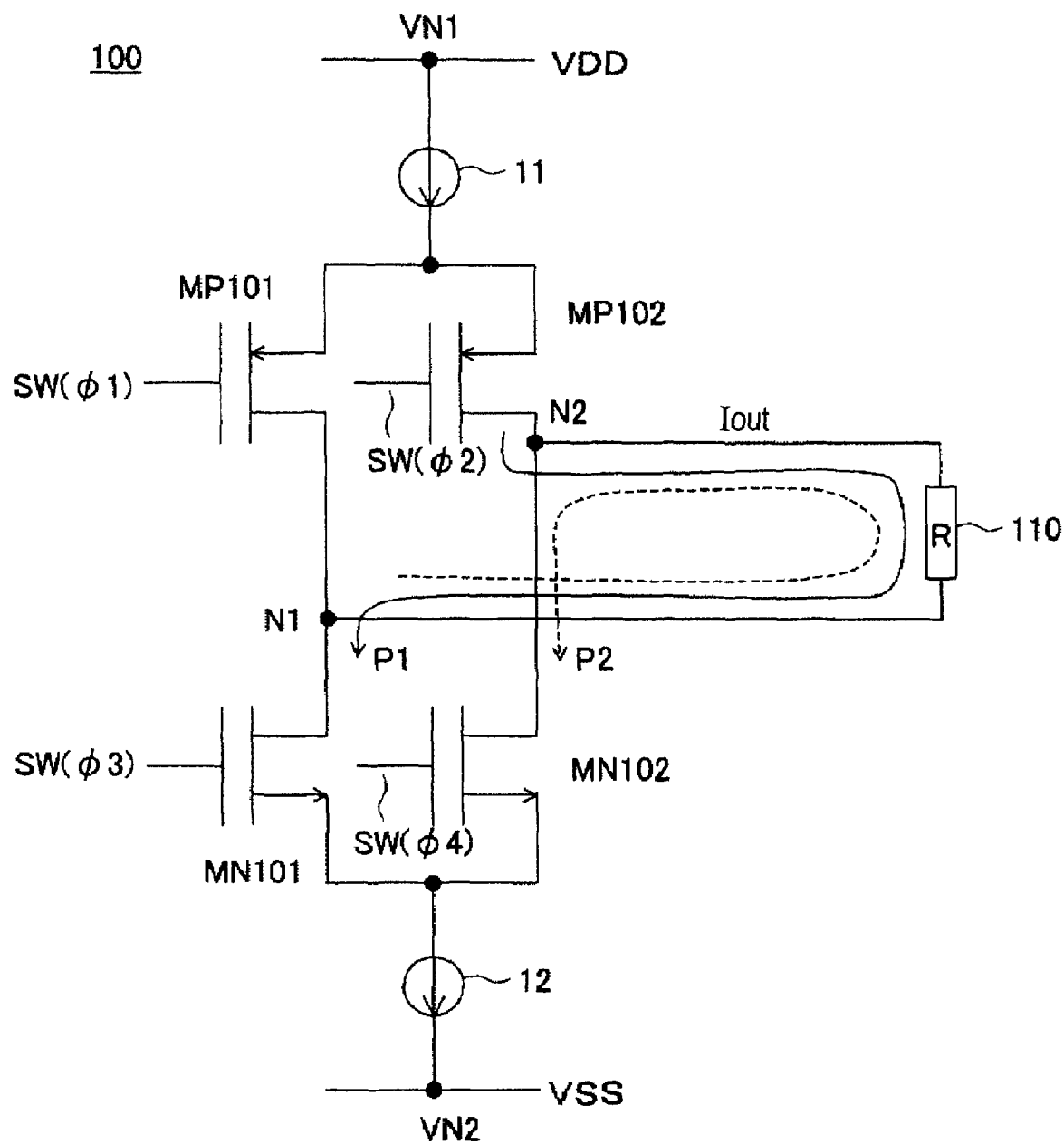
FIG. 1 is a basic circuit diagram of an LVDS circuit.
Figure 2:
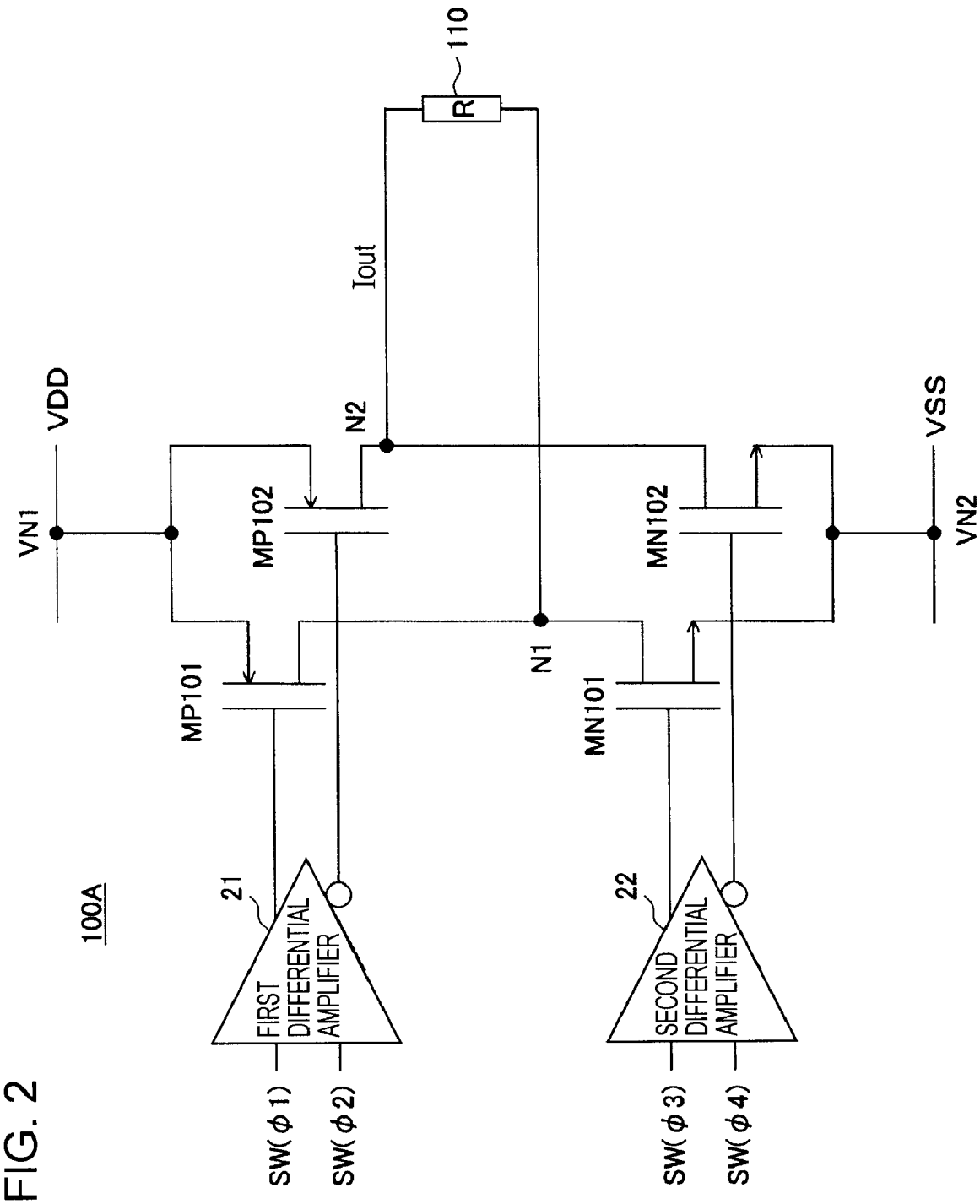
FIG. 2 is a circuit diagram illustrating a related art LVDS circuit.

The arrangement of the transistors MP1, MN1, MP2, and MN2 in the LVDS basic circuit 1a is equivalently similar to that of the transistors MP101, MN101, MP102, and MN102 in each of the LVDS circuit 100 in FIG. 1 and the LVDS circuit 100A in FIG. 2.

As will be described later, however, the transistors MP1, MN1, MP2, and MN2 do not operate analog switches in a manner similar to the transistors in FIG. 1. The transistors MP1, MN1, MP2, and MN2 each function as a current source. Therefore, each transistor has a smaller size than that of each transistor in the related art LVDS circuit in FIG. 1. In other words, there are many differences between the LVDS circuit 1 and the related art LVDS circuit 100 of FIG. 1.

Note that the LVDS circuit 1 does not include the first current source 11 and the second current source 12 in the related art LVDS circuit 100 of FIG. 1.

Switching Circuit 1b

Referring to FIGS. 3 and 4, the LVDS circuit 1 includes the switching circuit 1b. The switching circuit 1b includes a first switch group 1b1 including first to fourth switches SW1 to SW4 and a second switch group 1b2 including fifth to eighth switches SW5 to SW8.

The first to eighth switches SW1 to SW8 each include, for example, a transistor. Each switch is turned on or off in response to a switching drive signal SW.

Referring to FIGS. 3 and 4, in each of the first to eighth switches SW1 to SW8, when a contact portion, shown by a solid line, connects to both terminals, represented by a blank circle, of the switch, the switch is closed (i.e., turned on or enters a conduction state. When the contact portion does not connect to both the terminals thereof, the switch is opened (i.e., turned off or enters a non-conduction state). In the present embodiment, since the first to eighth switches SW1 to SW8 are the transistor switches, the connection of both the terminals of each switch (closing the switch) through the contact portion corresponds to the conduction state of the transistor and the disconnection of both the terminals thereof (opening the switch) corresponds to the non-conduction state of the transistor.

In FIGS. 3 and 4, the parallel-connected switches, such as the first and second switches SW1 and SW2, the third and fourth switches SW3 and SW4, the fifth and sixth switches SW5 and SW6, and the seventh and eighth switches SW7 and SW8, are anti-phase (complementary) switches. In other words, when one of the parallel-connected switches is turned on (in the conduction state), the other one is turned off (in the non-conduction state).

The control circuit 90 outputs first to fourth switching drive signals SW(φ1) to SW(φ4) and first to fourth inverted switching drive signals SW(φ1−) to SW(φ4−). Regarding the inverted switching drive signals in FIGS. 3 and 4, for example, the sign "SW(φ1)" with a bar "−" thereon denotes the first inverted switching drive signal. In this description, the sign "SW(φ1−)" denotes the first inverted switching drive signal. The other inverted switching drive signals are similarly designated.

The operation of the switching circuit 1b will be described later with reference to FIGS. 5 and 6.

Bias Circuit 1c

Referring to FIGS. 3 and 4, the LVDS circuit 1 includes the bias circuit 1c(30), which is not included in the related art LVDS circuits in FIGS. 1 and 2. The bias circuit 1c includes a first bias circuit 31 for outputting a first bias voltage $V_{BIAS}1$ and a second bias circuit 32 for outputting a second bias voltage $V_{BIAS}2$.

The first bias circuit 31 generates the first bias voltage $V_{BIAS}1$ on the basis of the first voltage VDD. The second bias circuit 32 generates the second bias voltage $V_{BIAS}2$ on the basis of the second voltage VSS. The first and second bias circuits 31 and 32 will be described in detail later with reference to FIG. 9.

The first bias circuit 31 applies the first bias voltage $V_{BIAS}1$ to the gate of the transistor MP1 through the third switch SW3 or the gate of the transistor MP2 through the fourth switch SW4, the third and fourth switches SW3 and SW4 being driven in a complementary manner. On the other hand, the second bias circuit 32 applies the second bias voltage $V_{BIAS}2$ to the gate of the transistor MN1 through the fifth switch SW5 or the gate of the transistor MN2 through the sixth switch SW6, the fifth and sixth switches SW5 and SW6 being driven in a complementary manner.

In the complementary (or anti-phase) operation, for example, when the third switch SW3 is turned on, the fourth switch SW4 is turned off, and vice versa.

First Mode

FIG. 3 illustrates the LVDS circuit 1 in the first mode (first phase).

In the first mode, for example, the control circuit 90 turns on (closes) the second, third, sixth, and seventh switches SW2, SW3, SW6, and SW7 so that the first voltage VDD is applied to the P-channel transistor MP2, the first bias voltage $V_{BIAS}1$ output from the first bias circuit 31 is applied to the P-channel transistor MP1, the second voltage VSS is applied to the N-channel transistor MN1, and the second bias voltage $V_{BIAS}2$ output from the second bias circuit 32 is applied to the N-channel transistor MN2. The other switches SW are turned off (in the non-conduction state).

The switch control operation of the control circuit 90 will now be described in detail.

In the first mode shown in FIG. 3, the control circuit 90 controls the second inverted switching drive signal SW(φ2−) at a high level, the first switching drive signal SW(φ1) at the high level, the fourth switching drive signal SW(φ4) at the high level, and the third inverted switching drive signal SW(φ3−) at the high level to be supplied to the second, third, sixth, and seventh switches SW2, SW3, SW6, and SW7, respectively. On the other hand, the control circuit 90 controls the first inverted switching drive signal SW(φ1−) at a low level, the second switching drive signal SW(φ2) at the low level, the third switching drive signal SW(φ3) at the low level, and the fourth inverted switching drive signal SW(φ4−) at the low level to be supplied to the first, fourth, fifth, and eighth switches SW1, SW4, SW5, and SW8, respectively.

Consequently, the first voltage VDD is applied to the gate of the transistor MP2, thus turning off the transistor MP2. The first bias voltage $V_{BIAS}1$ is applied to the gate of the transistor MP1, so that the transistor MP1 functions as a current source. The second voltage VSS is applied to the gate of the transistor MN1, thus turning off the transistor MN1. The second bias voltage $V_{BIAS}2$ is applied to the gate of the transistor MN2, so that the transistor MN2 functions as a current source.

Thus, the first power supply node VN1, a third node N3, the transistor MP1 functioning as the current source, the first node N1, the load circuit 110, the second node N2, the transistor MN2 functioning as the current source, a fourth node N4, and the second power supply node VN2 constitute a first circuit.

An output current Iout, indicated by a dashed line, flows through the load circuit 110 such that the current flows from the first node N1 to the second node N2. This output current Iout is negative.

Figure 5:
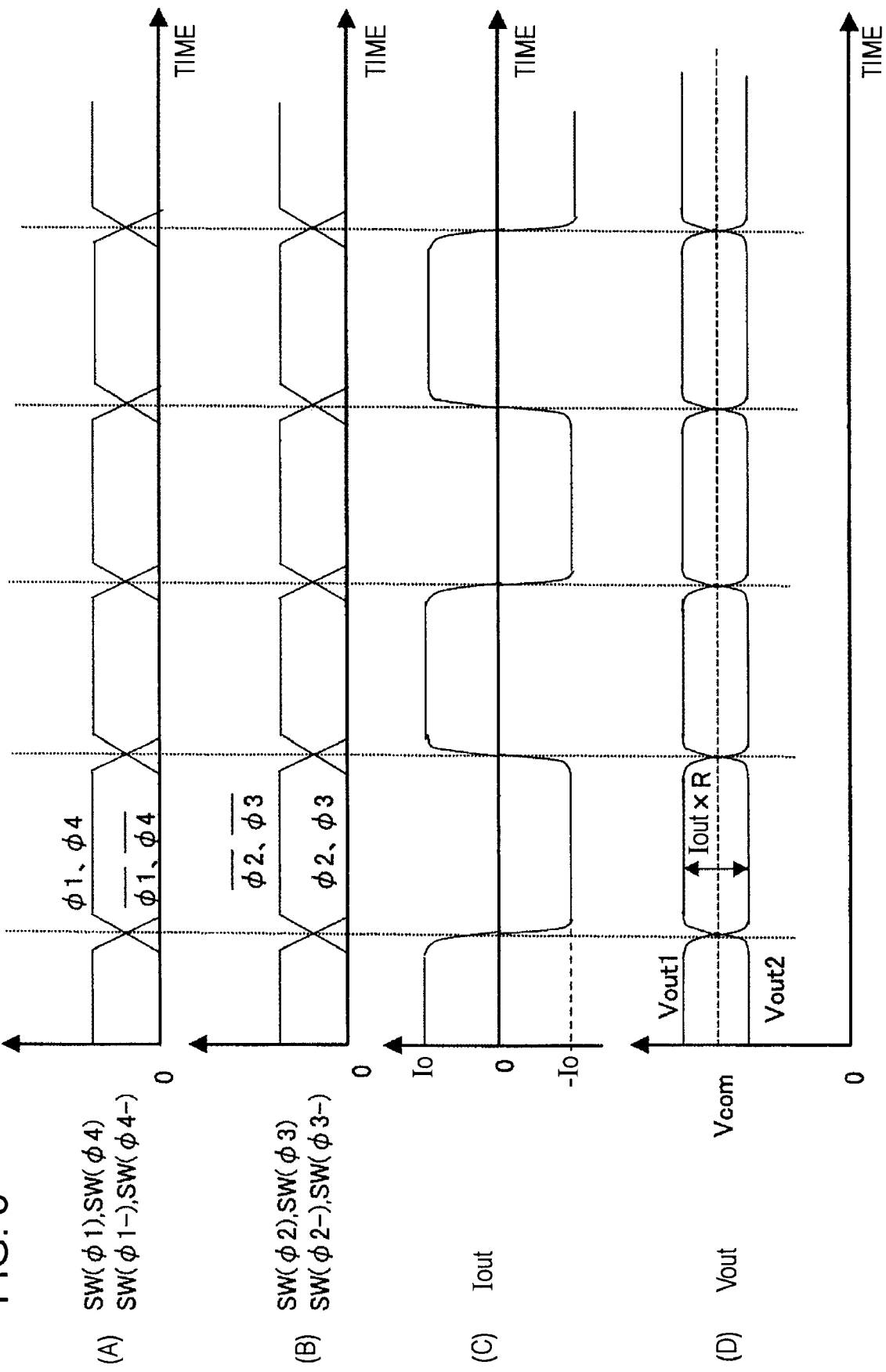
FIG. 5 is a first signal waveform diagram related to the LVDS circuit shown in FIGS. 3 and 4.

In FIG. 5, parts (A) and (B) show the waveforms of the first to fourth switching drive signals SW(φ1) to SW(φ4) and the first to fourth inverted switching drive signals SW(φ1−) to SW(φ4−).

Figure 6:
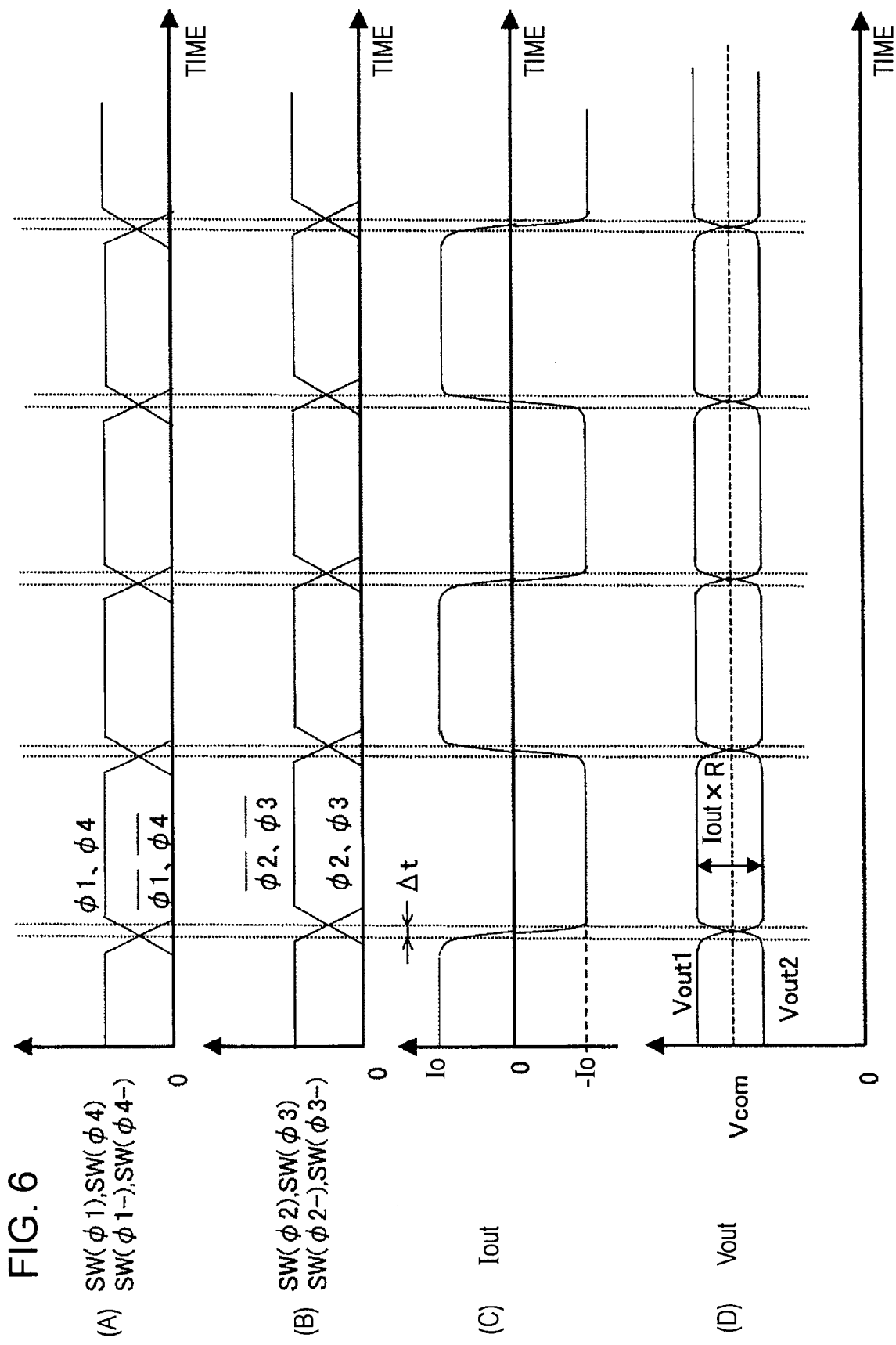
FIG. 6 is a second signal waveform diagram related to the LVDS circuit shown in FIGS. 3 and 4.

The waveforms shown in parts (A) and (B) in FIG. 5 include no delay time (jitter) Δt, which is included in parts (A) and (B) in FIG. 6.

Part (C) in FIG. 5 shows the waveform of the output current Iout flowing through the load circuit 110. For the output current Iout in part (C) in FIG. 5, Io indicates a positive output current designated by a solid line in FIG. 4 and −Io indicates a negative output current designated by the dashed line in FIG. 3. Part (D) in FIG. 5 shows a terminal voltage Vout across the load circuit 110. In part (D), Vcom denotes a common mode voltage.

Second Mode

FIG. 4 shows the second mode (second phase) of the LVDS circuit 1.

In the second mode that is opposite in phase to and is complementary to the first mode, the control circuit 90 turns on the first, fourth, fifth, and eighth switches SW1, SW4, SW5, and SW8 so that the first voltage VDD is applied to the P-channel transistor MP1, the first bias voltage $V_{BIAS}1$ of the first bias circuit 31 is applied to the P-channel transistor MP2, the second voltage VSS is applied to the N-channel transistor MN2, and the second bias voltage $V_{BIAS}2$ of the second bias circuit 32 is applied to the N-channel transistor MN1. The other switches are turned off (opened).

The switch control operation of the control circuit 90 will now be described in more detail.

In the second mode shown in FIG. 4, the control circuit 90 controls the first inverted switching drive signal SW(φ1−) at the high level, the second switching drive signal SW(φ2) at the high level, the third switching drive signal SW(φ3) at the high level, and the fourth inverted switching drive signal SW(φ4−) at the high level to be supplied to the first, fourth, fifth, and eighth switches SW1, SW4, SW5, and SW8, respectively, as shown in FIG. 5. On the other hand, the control circuit 90 controls the second inverted switching drive signal SW(φ2−) at the low level, the first switching drive signal SW(φ1) at the low level, the fourth switching drive signal SW(φ4) at the low level, and the third inverted switching drive signal SW(φ3−) at the low level to be supplied to the second, third, sixth, and seventh switches SW2, SW3, SW6, and SW7, respectively.

Consequently, the first voltage VDD is applied to the gate of the transistor MP1, thus turning off the transistor MP1. The first bias voltage $V_{BIAS}1$ is applied to the gate of the transistor MP2, so that the transistor MP2 functions as a current source. The second voltage VSS is applied to the gate of the transistor MN2, thus turning off the transistor MN2. The second bias voltage $V_{BIAS}2$ is applied to the gate of the transistor MN1, so that the transistor MN1 functions as a current source.

Thus, the first power supply node VN1, the third node N3, the transistor MP2 functioning as the current source, the second node N2, the load circuit 110, the first node N1, the transistor MN1 functioning as the current source, the fourth node N4, and the second power supply node VN2 constitute a second circuit.

The output current Iout, indicated by the solid line, flows through the load circuit 110 such that the output current flows from the node N2 to the node N1. The output current Iout is positive.

In the LVDS circuit 1 shown in FIGS. 3 and 4, preferably, the first bias voltage $V_{BIAS}1$ and the second bias voltage $V_{BIAS}2$ are set so that a current flowing from the drain of the transistor MP1 or MP2 is equivalent to a current flowing into the drain of the transistor MN1 or MN2.

As described above, preferably, the transistors MP1 and MP2 are formed so as to have the same size and the transistors MN1 and MN2 are similarly formed so as to have the same size. According to the present embodiment, therefore, the transistors MP1, MP2, MN1, and MN2 are designed so that bias currents with the same amplitude flow through the transistors MP1 and MP2 and bias currents with the same amplitude flow through the transistors MN1 and MN2.

As described above, in the first mode, when the gate of the transistor MP1 is connected to the first bias circuit 31, the gate of the transistor MN2 is simultaneously connected to the second bias circuit 32. On the other hand, in the second mode, when the gate of the transistor MP2 is connected to the first bias circuit 31, the gate of the transistor MN1 is simultaneously connected to the second bias circuit 32. In other words, the transistors MP1 and MP2 are connected to the first bias circuit 31 in a complementary manner (i.e., in anti-phase timing relation). Similarly, the transistors MN2 and MN1 are connected to the second bias circuit 32 in a complementary manner.

The connection in the first mode and that in the second mode may be interchanged.

Applying a bias current controls the direction of current flowing through the load circuit 110, equivalently indicated as the resistor R. The control will now be described in detail below.

The output current Iout flowing through the load circuit 110 in the LVDS circuit 1 can be expressed according to the above-described current path (circuit) P1 upon application of the first bias voltage $V_{BIAS}1$ or the current path (circuit) P2 upon application of the second bias voltage $V_{BIAS}2$ using the following Expression (3) or (4).

$$Iout = Kp \times (W1/L1) \times (V_{BIAS}1 - VthP)^2 \quad (3)$$

where Kp denotes a specific constant, W1 and L1 indicate the gate width and the gate length of the P-channel transistor MP1, respectively, $V_{BIAS}1$ denotes the first bias voltage applied to the gate of the transistor MP1, and VthP indicates the threshold voltage of the transistor MP1.

$$Iout = Kn \times (W2/L2) \times (V_{BIAS}2 - VthN)^2 \quad (4)$$

where Kn denotes a specific constant, W2 and L2 indicate the gate width and the gate length of the N-channel transistor MN1, respectively, $V_{BIAS}2$ denotes the second bias voltage applied to the gate of the transistor MN1, and VthN indicates the threshold voltage of the transistor MN1.

In the present embodiment, preferably, the transistors MP1 and MP2 have the same size and the transistors MN1 and MN2 similarly have the same size.

Further, the first and second bias circuits 31 and 32 control the first and second bias voltages $V_{BIAS}1$ and $V_{BIAS}2$ to supply the same bias current to the transistors MP1 and MP2 and supply the same bias current to the other transistors MN1 and MN2.

In the LVDS circuit 1 in the first mode shown in FIG. 3, for example, assuming that the third and sixth switches SW3 and SW6 are turned-on switching elements, the first bias circuit 31, the third switch SW3, and the transistor MP1 constitute a current source for the load circuit 110. The second bias circuit 32, the sixth switch SW6, and the transistor MN2 constitute a current source for the load circuit 110.

In addition, assuming that the fourth switch SW4 and the fifth switch SW5 are turned-on switching elements in the LVDS circuit 1 in the second mode shown in FIG. 4, the first bias circuit 31, the fourth switch SW4, and the transistor MP2 constitute a current source for the load circuit 110. The second bias circuit 32, the fifth switch SW5, and the transistor MN1 constitute a current source for the load circuit 110.

As described above, in the LVDS circuit 1 according to the present embodiment, the transistors MP1 and MP2 and the transistors MN1 and MN2 function as the current sources, rather than mere turned-on or -off transistors. In other words, the LVDS circuit 1 includes the current sources but does not substantially include analog switches for the load circuit 110. Consequently, the influences by the on-resistances of the transistors can be eliminated in a manner similar to the case expressed in Expression (2), thus realizing the low voltage operation.

In the LVDS circuit 1 shown in FIGS. 3 and 4, the output circuits (e.g., the transistors MN1 and MN2) do not substantially include analog switches. Instead, the LVDS circuit 1 includes the switches SW1 to SW8 to be connected to the gates of the respective transistors to turn on or off those transistors, serving as output drivers. Charge current merely flows so as to charge those switches and the gate capacitors. It is unnecessary to increase the size of each of the transistors functioning as the switches SW1 to SW8.

As described above, each current path including the load circuit 110 does not substantially include the switches. Consequently, the transistors MP1 and MP2 and the transistors MN1 and MN2 in the LVDS circuit 1 can be reduced in size. Thus, the layout size of the LVDS circuit 1 can be reduced.

In the LVDS circuit 1 shown in FIGS. 3 and 4, since each output driver may be small in size. Advantageously, it is further unnecessary to arrange a short-circuit protection circuit for preventing a short circuit between an output terminal (e.g., the first node N1 or the second node N2) and the ground.

FIG. 6 shows a signal waveform diagram illustrating waveforms in a case where there is a delay time (or jitter (phase shift)) Δt between the combination of the first and fourth switching drive signals SW(φ1) and SW(φ4) and that of the second and third inverted switching drive signals SW(φ2−) and SW(φ3−).

It is more preferable to use switching drive signals with no delay time (jitter) Δt as illustrated in parts (A) to (D) in FIG. 5. If the jitter Δt is several percent, e.g., 5% or 6% smaller than 10%, the common mode voltage is constant, so that the LVDS circuit 1 normally operates.

In the LVDS circuit 1 according to the present embodiment, therefore, the control circuit 90 for outputting switching drive signals does not have to be adapted to special requirements in terms of timing. Alternatively, a differential signal to be transmitted to the load circuit 110 does not meet strict requirements.

If there is a jitter Δt as shown in parts (A) and (B) of FIG. 6, the transistors MP1 and MP2 and the transistors MN1 and MN2 can be reduced in size because each current path including the load circuit 110 in the LVDS circuit 1 shown in FIG. 3 or 4 does not include switches.

Since the size of each output driver in the LVDS circuit 1 is small, the LVDS circuit 1 does not need a short-circuit protection circuit. In addition, the layout area of the LVDS circuit 1 can be reduced, resulting in a reduction in the cost of the LVDS circuit 1.

As described above, in the LVDS circuit 1 shown in FIGS. 3 and 4, a power supply voltage, such as the first voltage VDD, can be lowered without increasing the circuit scale.

Advantageously, the reduction in power supply voltage extends the service life of a battery in a battery-operated electronic device, such as a mobile phone, a digital camera, a portable communication unit, or a portable electronic device.

For example, data transfer speed is further increasing in association with progress toward higher precision and higher image quality of imaging devices. On the other hand, high-speed interface, such as an LDVS or a DDR, is required for data transfer under conditions that the number of pins of an integrated circuit and the size of a chip are restricted. Accordingly, the miniaturization and higher performance of a cell used for high speed interface significantly affects the cost and performance (features) of an LSI.

According to the present embodiment of the present invention, therefore, the LVDS circuit 1 can be effectively utilized as a miniaturized, high-performance, and low power consumption LVDS circuit from the above-described viewpoint.

Second Embodiment

An LVDS circuit according to a second embodiment of the present invention will now be described with reference to FIG. 7.

Figure 7:
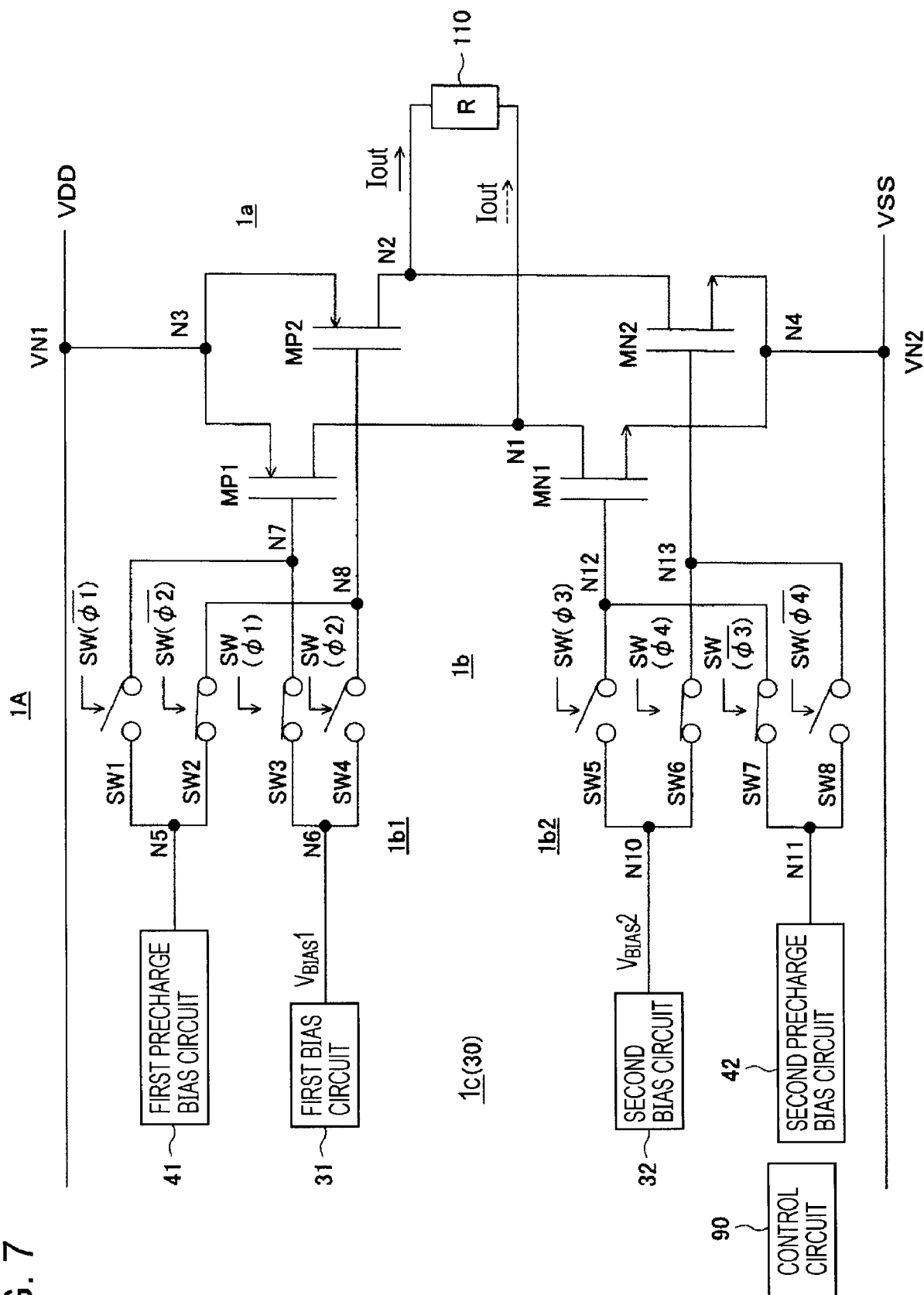
FIG. 7 is a circuit diagram of an LVDS circuit according to a second embodiment of the present invention.

Referring to FIG. 7, an LVDS circuit 1A includes a first precharge bias circuit 41 and a second precharge bias circuit 42 in addition to components similar to those of the LVDS circuit 1 shown in FIGS. 3 and 4.

The first precharge bias circuit 41 outputs a voltage approximate to the threshold voltages VthP of transistors MP1 and MP2. The second precharge bias circuit 42 outputs a voltage approximate to the threshold voltages VthN of transistors MN1 and MN2.

First and second bias circuits 31 and 32 are similar to those of the first embodiment.

In the case where the LVDS circuit 1 illustrated in FIGS. 3 and 4 is allowed to operate at high speed, it is necessary to rapidly turn on and off the transistors MP1, MP2, MN1, and MN2, which serve as output drivers, through the gate capacitors thereof.

The first-mode operation of the LVDS circuit 1A shown in FIG. 7 will now be described.

A third switch SW3 is turned on (conduction state), so that the transistor MP1 is biased by a first bias voltage VBIAS1 output from the first bias circuit 31 and is turned on. A sixth switch SW6 is turned on, so that the transistor MN2 is biased by a second bias voltage $V_{BIAS}2$ output from the second bias circuit 32 and is turned on. A second switch SW2 is turned on, so that the transistor MP2 is precharged by a precharge voltage output from the first precharge bias circuit 41 while being turned off. A seventh switch SW7 is turned on, so that the transistor MN1 is precharged by a precharge voltage output from the second precharge bias circuit 42 while being turned off.

In the first mode, the transistor MP2 and the transistor MN1 are precharged in this manner. When the LVDS circuit 1A is switched from the first mode to the second mode, those transistors are rapidly turned on.

A control circuit 90 controls the above-described switches SW so that the above-described operation is performed. In other words, the first bias circuit 31 and the first precharge bias circuit 41 are connected to the transistors MP1 and MP2 in a complementary manner and the second bias circuit 32 and the second precharge bias circuit 42 are connected to the transistors MN2 and MN1 in a complementary manner.

The connection in the second mode is reversed relative to that in the first mode.

The comparison of the operation using precharged transistors with that using unprecharged transistors will now be described.

In the following description, the comparison will be explained using P-channel drivers (transistors) as an example. The same applies to N-channel drivers.

The following Expression (5) represents time t1 to charge the gate of each output driver in the LVDS circuit 1, shown in FIGS. 3 and 4, to α% (e.g., α=95%) without precharging.

$$(Vth+Vov)\times\{1-\exp(-t1/C1\times R1)\}=(Vth+Vov)\times 0.95 \quad (5)$$

where C1 denotes the gate capacitance of the P-channel driver (transistor), R1 denotes the on-resistance of any of the first to eighth switches SW1 to SW8, Vov indicates the overdrive voltage of the P-channel driver.

Solving Expression (5) gives Expression (6).

$$t1=30.0\times C1\times R1 \quad (6)$$

The operation using the precharged transistors will now be described.

The following Expression (7) represents time t2 to charge the gate of each output driver in the LVDS circuit 1A in FIG. 7 to α% (e.g., α=95%) while precharging.

$$Vth+[Vov\times\{1-\exp(-t2/C1\times R1)\}]=(Vth+Vov)\times 0.95 \quad (7)$$

Solving Expression (7) gives Expression (8).

$$t2=-C1\times R1\times \log[0.05\times(Vth+Vov)/Vov] \quad (8)$$

For example, assuming that the threshold voltage Vth is 1 V, the overdrive voltage Vov of the P-channel driver (transistor) is 0.5 V, the charge time t2 is expressed as follows.

$$t2=1.89\times C1\times R1 \quad (9)$$

When Expression (6) is compared to Expression (9), 1.89/3.0=0.63. Consequently, precharging the transistors can reduce the charge time by approximately 37%. To put it another way, the maximum operating frequency of the LVDS circuit 1A in FIG. 7 is approximately 37% higher than that of the LVDS circuit 1 in FIGS. 3 and 4.

In the LVDS circuit 1 without precharging the transistors in FIGS. 3 and 4, charge (=the threshold voltage Vth×the gate capacitance C1 of each driver) is wasted each time the logic of the LVDS circuit is changed, i.e., every switching operation. From the above-described viewpoint, the LVDS circuit 1A in FIG. 7 can prevent the waste of charge, thus reducing the power consumption.

Figure 8:
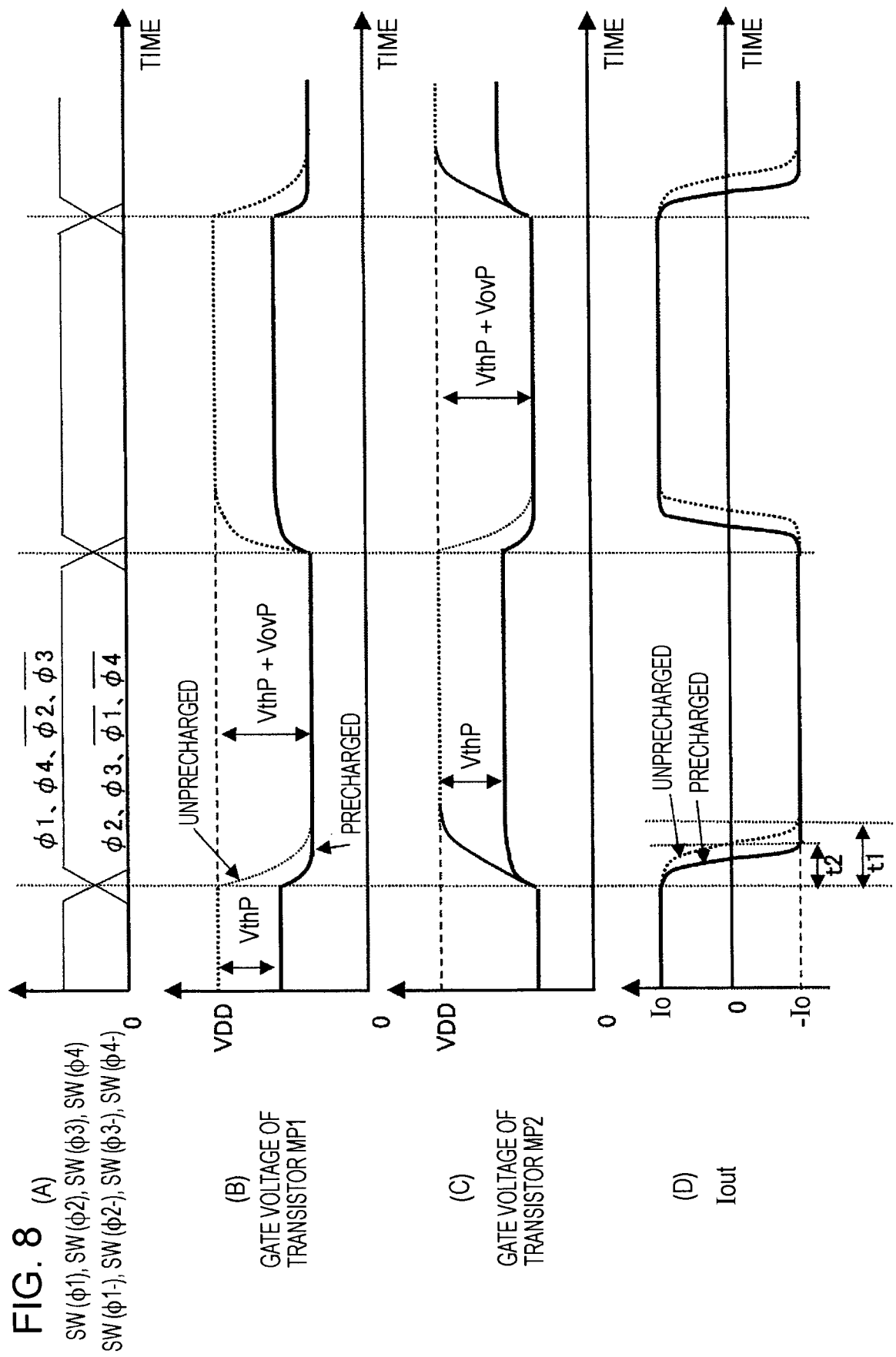
FIG. 8 is a signal waveform diagram related to the LVDS circuit in FIG. 7.

FIG. 8 shows a signal waveform diagram showing waveforms in the case where the transistors in the LVDS circuit 1 in FIGS. 3 and 4 are unprecharged and those in the case where the transistors in the LVDS circuit 1A in FIG. 7 are precharged.

As described above, precharging the transistors prevents a reduction in maximum operating frequency, the reduction being caused by a decrease in power supply voltage.

Third Embodiment

An LVDS circuit 1B according to a third embodiment of the present invention will now be described with reference to FIG. 9.

Figure 9:
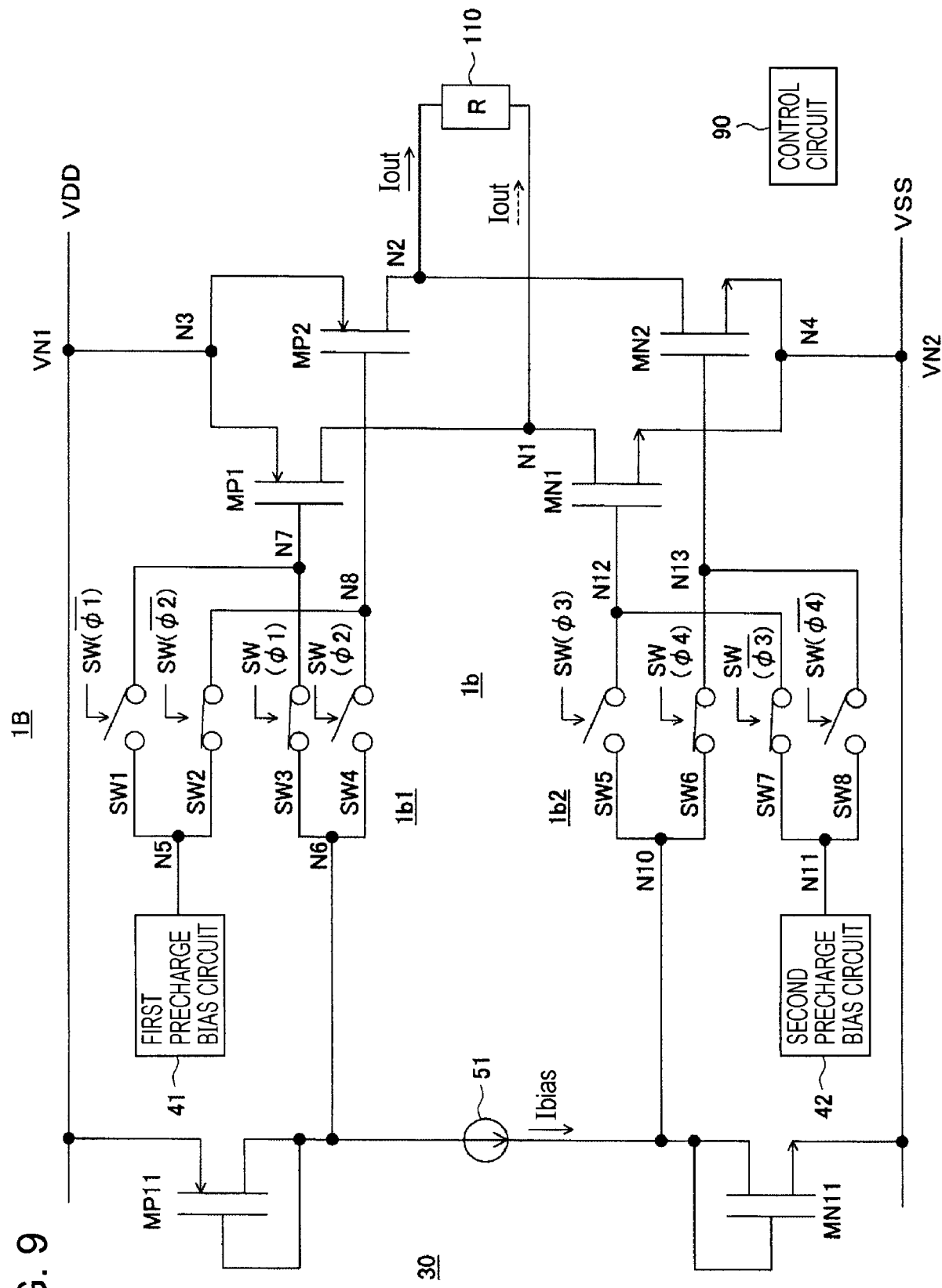
FIG. 9 is a circuit diagram of an LVDS circuit according to a third embodiment of the present invention.

Referring to FIG. 9, open and closed states (conduction and non-conduction states) of first to eighth switches SW1 to SW8 in the LVDS circuit 1B in the first mode are the same as those in the first mode shown in FIG. 3. Therefore, open and closed states of the first to eighth switches SW1 to SW8 in the second mode are reversed relative to those in the first mode.

The LVDS circuit 1B includes components similar to the first bias circuit 31 and the second bias circuit 32 in FIGS. 3 and 4.

In FIG. 9, the first and second bias circuits 31 and 32 are realized by a bias current source 51, a transistor MP11, and a transistor MN11.

The first and second bias circuits 31 and 32 are collectively called a bias circuit 30.

The gate of the transistor MP11 is connected to the drain thereof. The transistor MP11 substantially functions as a diode. Similarly, the gate of the transistor MN11 is connected to the drain thereof. The transistor MN11 substantially functions as a diode.

The bias current source 51 has a simple structure in which current is supplied to the two diodes. This leads to a relative reduction in current consumption.

In the LVDS circuit 1B in FIG. 9, the transistor MP11 (diode) constituting the first bias circuit 31 and a transistor MP1 or MP2 form a current mirror circuit such that the diode and the transistor are arranged with the third or fourth switch SW3 or SW4 therebetween.

Similarly, the transistor MN11 (diode) constituting the second bias circuit 32 and a transistor MN1 or MN2 form a current mirror circuit such that the diode and the transistor are arranged with the fifth or sixth switch SW5 or SW6 therebetween.

The current mirror circuits each operate as a stable current source. Therefore, the LVDS circuit 1B in FIG. 9 operates in the use of the stable current sources.

As described above, the LVDS circuit 1B in FIG. 9 is realized as a circuit with low current consumption while providing the current mirror circuits, serving as stable current sources, and the same advantages as those of the LVDS circuit 1 in FIGS. 3 and 4.

Fourth Embodiment

The bias circuit 30 in FIG. 9 can be applied to the LVDS circuit 1A in FIG. 7 instead of the first and second bias circuits 31 and 32. Consequently, an LVDS circuit providing the same advantages as those the second embodiment and those of the third embodiment can be realized.

Fifth Embodiment

An LVDS circuit 1C according to a fifth embodiment of the present invention will now be described with reference to FIG. 10.

Figure 10:
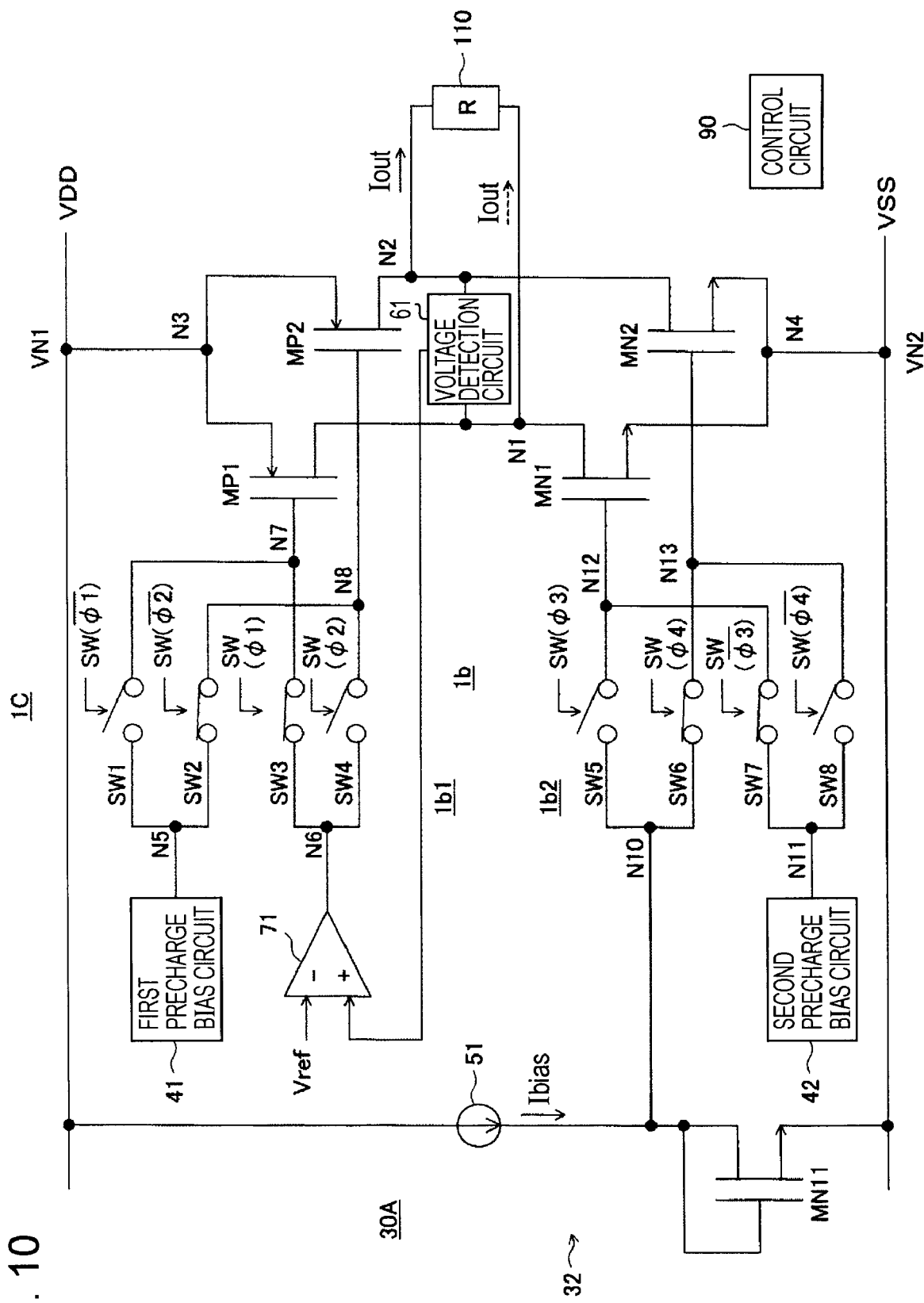
FIG. 10 is a circuit diagram of an LVDS circuit according to a fifth embodiment of the present invention.

In the LVDS circuit 1C in FIG. 10, open and closed states of first to eighth switches SW1 to SW8 in the first mode are the same as those in FIG. 7. Therefore, those states of the switches SW1 to SW8 in the second mode are reversed relative to those in the first mode.

The LVDS circuit 1C does not include the transistor MP11, which is connected to the third and fourth switches SW3 and SW4 in FIG. 9 in order to control the common mode voltage. The LVDS circuit 1C includes a differential operational amplifier circuit 71, serving as a comparator circuit, and a voltage detection circuit 61. The differential operational amplifier circuit 71 is connected to a common node (sixth node N6) between the third and fourth switches SW3 and SW4. The voltage detection circuit 61 is arranged between a first node N1 and a second node N2.

In the LVDS circuit 1C, the voltage detection circuit 61 detects (determines) the voltage between the first and second nodes N1 and N2, i.e., an output voltage Vout and applies the detected voltage Vout to a non-inverting input terminal (+) of the differential operational amplifier circuit 71.

The differential operational amplifier circuit 71 compares the detected voltage Vout supplied from the voltage detection circuit 61 with a reference voltage Vref applied to an inverting input terminal (−) of the circuit 71. The differential operational amplifier circuit 71 applies a bias voltage proportional to the difference between the voltages Vout and Vref to the gate of a transistor MP1 through the third switch SW3 and also applies the bias voltage to the gate of a transistor MP2 through the fourth switch SW4.

The LVDS circuit 1C can control the common mode voltage by further including the differential operational amplifier circuit 71 and the voltage detection circuit 61.

Since the LVDS circuit 1C includes the differential operational amplifier circuit 71, it is necessary to set the frequency band of a loop including the differential operational amplifier circuit 71 and the output drivers at or below a frequency determined by a slew rate in the switching operation.

Advantageously, the LVDS circuit 1C can control the common mode voltage while providing the same advantages as those of the LVDS circuit 1 in FIGS. 3 and 4 and those of the LVDS circuit 1A in FIG. 7.

In the LVDS circuit 1C, a bias circuit 30A may include a bias current source 51, a transistor MN11, the differential operational amplifier circuit 71, and the voltage detection circuit 61.

The bias current source 51 and the transistor MN11 correspond to the second bias circuit 32. The differential operational amplifier circuit 71 and the voltage detection circuit 61 correspond to the first bias circuit 31.

Sixth Embodiment

An LVDS circuit 1D according to a sixth embodiment of the present invention will now be described with reference to FIG. 11.

Figure 11:
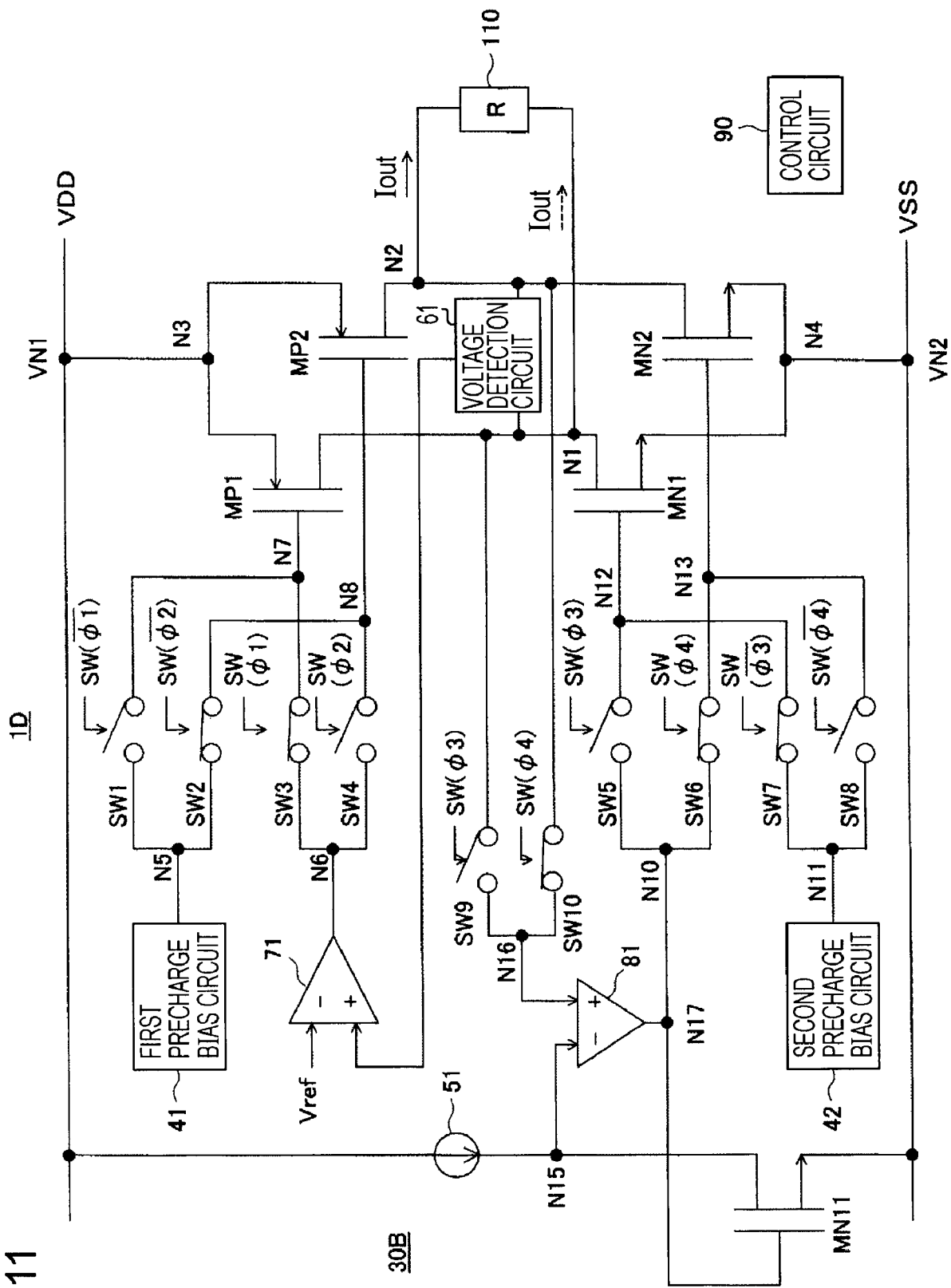
FIG. 11 is a circuit diagram of an LVDS circuit according to a sixth embodiment of the present invention.

In the LVDS circuit 1D in FIG. 11, open and closed states of first to eighth switches SW1 to SW8 in the first mode are the same as those in the first mode shown in FIG. 7. Therefore, open and closed states of the first to eighth switches SW1 to SW8 in the second mode are reversed relative to those in the first mode.

The LVDS circuit 1D is obtained by modifying the LVDS circuit 1C in FIG. 10 as follows.

(1) The LVDS circuit 1D further includes a differential operational amplifier circuit 81. An inverting input terminal (−) of the differential operational amplifier circuit 81 is connected to a node (fifteenth node N15) between a bias current source 51 and the source (or drain) of a transistor MN11. A non-inverting input terminal (+) of the differential operational amplifier circuit 81 is connected to a node (sixteenth node N16) between a ninth switch SW9 and a tenth switch SW10. An output terminal of the differential operational amplifier circuit 81 is connected to a seventeenth node N17 between the gate of the transistor MN11 and a node (tenth node N10) between the fifth and sixth switches SW5 and SW6.

(2) The ninth switch SW9 is further arranged between the first node SW1 and the non-inverting input terminal (+) of the differential operational amplifier circuit 81. The tenth switch SW10 is further arranged between the second node SW2 and the non-inverting input terminal (+) of the circuit 81.

(3) Unlike the transistor MN11 in FIG. 10 which is diode-connected to the bias current source 51 and is included in the second bias circuit 32, the gate of the transistor MN11 is connected to the output terminal of the differential operational amplifier circuit 81 through the seventeenth node N17. The transistor MN11 functions as a part of a current mirror circuit.

Reducing the size of each output driver as much as possible to reduce the layout area of the LVDS circuit 1D causes the output driver to shift from the saturation region to the linear region. Simultaneously, a set output current decreases. In order to solve this problem, the differential operational amplifier circuit 81 and the ninth and tenth switches SW9 and SW10 are arranged so that the transistor MN11 is operated by an output signal from the differential operational amplifier circuit 81.

The differential operational amplifier circuit 81 controls the gate voltage of the transistor MN11 so that the drain voltage of the transistor MN11 supplied with a reference current is identical to the drain voltage of the output driver MN1 or MN2. Accordingly, the transistor MN11 and the transistor MN1 or MN2 operate as components of a precise current mirror circuit. Consequently, even when the output driver operates in its linear region, the output current agrees with a set value.

In the LVDS circuit 1D in FIG. 11, it is necessary to set the frequency band of a loop including a differential operational amplifier circuit 71 and the output driver at or below a frequency determined by the slew rate in the switching operation, similar to the LVDS circuit 1C in FIG. 10. In addition, it is necessary to set the frequency band of a loop including the differential operational amplifier circuit 81 and the output driver at or below a frequency determined by the slew rate in the switching operation.

As described above, even when the size (layout area) of each output driver in the LVDS circuit 1D in FIG. 11 is reduced as much as possible to reduce the layout area of the circuit 1D and the output driver shifts from the saturation region to the linear region due to the reduction, an output current can be matched to a set value, thus providing a desired output current.

It should be understood by those skilled in the art that various modifications, combinations, sub-combinations and alterations may occur depending on design requirements and other factors insofar as they are within the scope of the appended claims or the equivalents thereof.

For example, the polarities of the transistor constituting the LVDS circuits 1 to 1D may be reversed.

In addition, the above-described LVDS circuits may be appropriately used in combination.

What is claimed is:

1. A drive circuit, comprising:
a load circuit arranged between a first node and a second node;
a first series circuit arranged between a first power supply node for supply of a first voltage and a second power supply node for supply of a second voltage, the first series circuit including a first first-type transistor and a first second-type transistor connected in series with the first node therebetween;
a second series circuit including a second first-type transistor and a second second-type transistor connected in series with the second node therebetween;
a bias circuit that generates a first bias voltage to bias the first and second first-type transistors and generates a second bias voltage to bias the first and second second-type transistors;
first voltage applying means for, in a first mode, applying the first bias voltage to the first first-type transistor, applying the first voltage to the second first-type transistor, applying the second bias voltage to the second second-type transistor, and applying the second voltage to the first second-type transistor, the first voltage applying means including a plurality of switches;
second voltage applying means for, in a second mode, applying the first bias voltage to the second first-type transistor, applying the first voltage to the first first-type transistor, applying the second bias voltage to the first second-type transistor, and applying the second voltage to the second second-type transistor, the second voltage applying means including a plurality of switches, wherein
the combination of the first first-type transistor and the second second-type transistor or the combination of the second first-type transistor and the first second-type transistor cooperates with the bias circuit in functioning as the combination of current sources for the load circuit, and
the switches in the first voltage applying means and the switches in the second voltage applying means include:
a first switch and a second switch connected in parallel to apply the first voltage to the first and second first-type transistors in a complementary manner,
a third switch and a fourth switch connected in parallel to apply the first bias voltage to the first and second first-type transistors in a complementary manner,
a fifth switch and a sixth switch connected in parallel to apply the second bias voltage to the first and second second-type transistors in a complementary manner, and
a seventh switch and an eighth switch connected in parallel to apply the second voltage to the first and second second-type transistors in a complementary manner;
a voltage detection circuit that detects a voltage between the first and second nodes; and
a first differential operational amplifier circuit having a first input terminal and a second input terminal, the first input terminal being supplied with a reference voltage, the second input terminal being supplied with the voltage detected by the voltage detection circuit, wherein
the bias circuit includes
a series circuit arranged between the first and second power supply nodes, the series circuit including a bias current source and a diode, and
the first differential operational amplifier circuit, an output terminal of the first differential operational amplifier circuit is connected to a node between the third and fourth switches, and one terminal of the bias current source is connected to a node between the fifth and sixth switches.

2. A drive circuit comprising:

a load circuit arranged between a first node and a second node;

a first series circuit arranged between a first power supply node for supply of a first voltage and a second power supply node for supply of a second voltage, the first series circuit including a first first-type transistor and a first second-type transistor connected in series with the first node therebetween;

a second series circuit including a second first-type transistor and a second second-type transistor connected in series with the second node therebetween;

a bias circuit that generates a first bias voltage to bias the first and second first-type transistors and generates a second bias voltage to bias the first and second second-type transistors;

first voltage applying means for, in a first mode, applying the first bias voltage to the first first-type transistor, applying the first voltage to the second first-type transistor, applying the second bias voltage to the second second-type transistor, and applying the second voltage to the first second-type transistor, the first voltage applying means including a plurality of switches;

second voltage applying means for, in a second mode, applying the first bias voltage to the second first-type transistor, applying the first voltage to the first first-type transistor, applying the second bias voltage to the first second-type transistor, and applying the second voltage to the second second-type transistor, the second voltage applying means including a plurality of switches, wherein the combination of the first first-type transistor and the second second-type transistor or the combination of the second first-type transistor and the first second-type transistor cooperates with the bias circuit in functioning as the combination of current sources for the load circuit, and the switches in the first voltage applying means and the switches in the second voltage applying means include:
a first switch and a second switch connected in parallel to apply the first voltage to the first and second first-type transistors in a complementary manner,
a third switch and a fourth switch connected in parallel to apply the first bias voltage to the first and second first-type transistors in a complementary manner,
a fifth switch and a sixth switch connected in parallel to apply the second bias voltage to the first and second second-type transistors in a complementary manner, and
a seventh switch and an eighth switch connected in parallel to apply the second voltage to the first and second second-type transistors in a complementary manner;

a voltage detection circuit that detects a voltage between the first and second nodes;

a first differential operational amplifier circuit having a first input terminal and a second input terminal, the first input terminal being supplied with a reference voltage, the second input terminal being supplied with the voltage detected by the voltage detection circuit;

a series circuit arranged between the first and second power supply nodes, the series circuit including a bias current source and a transistor;

a second differential operational amplifier circuit having a first input terminal and a second input terminal, the first input terminal being connected to a node between the bias current source and the transistor; and a ninth switch and a tenth switch connected in parallel, the ninth and tenth switches being turned on and off in a complementary manner, the ninth switch being arranged between one terminal of the voltage detection circuit and the second input terminal of the second differential operational amplifier circuit, the tenth switch being arranged between the other terminal of the voltage detection circuit and the second input terminal of the second differential operational amplifier circuit, wherein the bias circuit includes
a series circuit including the bias current source and the transistor,
the first differential operational amplifier circuit,
the ninth switch,
the tenth switch, and
the second differential operational amplifier circuit;

an output terminal of the first differential operational amplifier circuit is connected to a node between the third and fourth switches, and an output terminal of the second differential operational amplifier circuit is connected to a node between the fifth and sixth switches and is connected to a control terminal of the transistor.

3. The circuit according to claim 1, further comprising:

a precharge bias circuit that generates a first precharge bias voltage approximate to the threshold voltages of the first and second first-type transistors and a second precharge bias voltage approximate to the threshold voltages of the first and second second-type transistors, wherein in the first mode, the first voltage applying means applies the first bias voltage to the first first-type transistor, applies the second bias voltage to the second second-type transistor, applies the first precharge bias voltage to the second first-type transistor, and applies the second precharge bias voltage to the first second-type transistor, and in the second mode, the second voltage applying means applies the first bias voltage to the second first-type transistor, applies the second bias voltage to the first second-type transistor, applies the first precharge bias voltage to the first first-type transistor, and applies the second precharge bias voltage to the second second-type transistor.

* * * * *